United States Patent
Park

(10) Patent No.: US 7,696,581 B2
(45) Date of Patent: Apr. 13, 2010

(54) ISOLATION FILM IN SEMICONDUCTOR DEVICE AND METHOD OF FORMING THE SAME

(75) Inventor: Sung Kee Park, Icheon-si (KR)

(73) Assignee: Hynix Semiconductor Inc., Icheon-si, Kyoungki-do (KR)

( * ) Notice: Subject to any disclaimer, the term of this patent is extended or adjusted under 35 U.S.C. 154(b) by 5 days.

(21) Appl. No.: 12/249,130

(22) Filed: Oct. 10, 2008

(65) Prior Publication Data

US 2009/0039459 A1    Feb. 12, 2009

Related U.S. Application Data

(62) Division of application No. 11/155,747, filed on Jun. 20, 2005, now Pat. No. 7,449,400.

(30) Foreign Application Priority Data

May 11, 2005    (KR) .................. 10-2005-0039439

(51) Int. Cl.
*H01L 29/76*    (2006.01)
*H01L 31/062*    (2006.01)

(52) U.S. Cl. .................. 257/374; 257/506; 257/510; 438/221; 438/296

(58) Field of Classification Search .................. 257/374, 257/506, 510, 647, E29.02, E21.68; 438/221, 438/296

See application file for complete search history.

(56) References Cited

U.S. PATENT DOCUMENTS

| 5,946,230 | A | * | 8/1999 | Shimizu et al. | ........ 365/185.01 |
| 6,438,030 | B1 | * | 8/2002 | Hu et al. | ................. 365/185.18 |
| 6,569,732 | B1 | | 5/2003 | Chiang et al. | |
| 6,872,667 | B1 | | 3/2005 | Shieh et al. | |
| 6,927,089 | B2 | | 8/2005 | Rhodes | |
| 2004/0183139 | A1 | | 9/2004 | Kim | |

FOREIGN PATENT DOCUMENTS

| CN | 1606146 | 4/2005 |
| JP | 2003-086766 | 3/2003 |
| KR | 1020040082881 | 9/2004 |
| KR | 1020040087043 | 10/2004 |

OTHER PUBLICATIONS

Publication dated Jan. 14, 2009, for Chinese application No. 200510136226.5.

* cited by examiner

*Primary Examiner*—Theresa T Doan
(74) *Attorney, Agent, or Firm*—Lowe Hauptman Ham & Berner, LLP

(57) ABSTRACT

The present invention relates to an isolation film in a semiconductor device and method of forming the same. An isolation film is formed in a doped region of a peripheral region, in which the doped region is isolated from a deep well region of a cell region and the isolation film is thicker than an isolation film of the cell region so that a parasitic transistor is not generated and a leakage current can be prevented.

3 Claims, 3 Drawing Sheets

ISOLATION FILM IN SEMICONDUCTOR DEVICE AND METHOD OF FORMING THE SAME

CROSS REFERENCE TO RELATED APPLICATION

This application is a divisional of U.S. Ser. No. 11/155,747, filed on Jun. 20, 2005 now U.S. Pat. No. 7,449,400. This application, in its entirety, is incorporated herein by reference.

BACKGROUND

1. Field of the Invention

The present invention relates to a method of fabricating a semiconductor device, and more specifically, to an isolation film in a semiconductor device and method of forming the same.

2. Discussion of Related Art

Generally, as the size of a NAND flash memory device shrinks, it is required that a depth of an isolation film in a cell region and a depth of an isolation film in a peripheral region be different in the process of forming the isolation film.

An isolation film has a dual depth at a boundary portion of the cell region and the peripheral region. If an isolation film having a dual depth is formed at a well boundary portion in a NAND flash memory, the following problems occur.

First, lots of well leakage is generated due to dislocation of a semiconductor substrate. Holes are formed in the well structure due to damage generated in an etch process for forming an isolation film having a dual depth or damage generated because of shortage of thermal budget. Accordingly, if a voltage is applied to the structure, a leakage path can be formed, which may degrade the voltage.

In view of the characteristics of a NAND flash memory, word lines within a cell array are connected up to a X-decoder. If a high bias voltage is applied to the word lines, a parasitic transistor can be formed at a boundary portion of an isolation film having a dual depth. This can degrade the performance of the operation of the memory.

Accordingly, there is a need for technologies capable of solving the problems generated since an isolation film having a dual depth is formed at a boundary portion of a cell region and a peripheral region.

SUMMARY OF THE INVENTION

Accordingly, the present invention has been made in view of the above problems, and it is an object of the present invention to provide an isolation film in a semiconductor device and method of forming the same, wherein problems generated since an isolation film having a dual depth is formed at a boundary portion of a cell region and a peripheral region can be solved.

To achieve the above object, according to an aspect of the present invention, there is provided a method forming an isolation film in a semiconductor device, including the steps of providing a semiconductor substrate in which a cell region, a peripheral region and a boundary region of the cell region and the peripheral region are defined, performing a first ion implant process to form a deep well region in a predetermined region of the cell region and a first doped region in a predetermined region of the boundary region, performing a second ion implant process to form a well region shallower than the deep well region within the deep well region of the cell region and a second doped region within the first doped region, thereby defining a doped region having the first doped region and the second doped region in the boundary region, performing a patterning process on predetermined regions of the cell region and the peripheral region to form a first trench having a first depth, performing a patterning process to expose a predetermined region of the peripheral region in which the first trenches is formed, and forming a second trench having a second depth deeper than the first depth only in the peripheral region, and forming an insulating film for trench burial only within the trenches of the result, thereby forming an isolation film having a first depth in the cell region, an isolation film having a second depth in the peripheral region, and an isolation film having a dual depth, which has the isolation film of the first depth and the isolation film of the second depth at the same, in the boundary region.

The method can further include the step of performing an ion implant process to expose a predetermined region of the deep well region and a predetermined region of the peripheral region, thus forming a well region in a region adjacent to the shallow well region within the deep well region, and a well region for peripheral region in the peripheral region, after the first ion implant process is completed.

The method can further include the step of performing an ion implant process to expose the cell region and the peripheral region adjacent to the doped region, thereby forming a field stop well in the cell region and the peripheral region adjacent to the doped region, respectively, after the second trench formation process is completed.

The doped region can be separated from the well regions formed in the cell region and the peripheral regions.

The first ion implant process or the second ion implant process can be implanted with the N type ion.

The doped region formed by means of the first ion implant process or the second ion implant process can be formed only using an N type ion.

According to another aspect of the present invention, there is provided a method forming an isolation film in a semiconductor device, including the steps of providing a semiconductor substrate in which a cell region, a peripheral region and a boundary region of the cell region and the peripheral region are defined, performing a first ion implant process to expose predetermined regions of the cell region and the boundary region of the cell region and the peripheral region, thereby forming a first well region in the cell region and the first doped region in the boundary region, performing a second ion implant process to expose predetermined regions of the cell region and the peripheral region on the result on which the first ion implant process is performed, thereby forming a second well region in the cell region where the first well region is formed and a third well region in the peripheral region, performing a third ion implant process to expose regions other than the region in which the second well region is formed in the cell region and the first doped region on the result on which the second ion implant process is performed, thereby forming a fourth well region in a region adjacent the second well region and a second doped region in the first doped region, whereby the doped region is defined at the boundary region, performing a patterning process on predetermined regions of the cell region and the peripheral region in the results on which the third ion implant process is performed, thereby forming a trench having a first depth, performing a patterning process to expose a predetermined region of the peripheral region in the results in which the first trench is formed, thereby forming a second trench, which has a second depth deeper than the first depth, only in the peripheral region, performing a fourth ion implant process to expose the cell region and the peripheral region adjacent to the doped region formed at the boundary portion in the result where the second trench is formed, thereby forming field stop wells in the cell region and the peripheral region adjacent to the doped region, and forming an insulating film for trench burial only within the first and second trenches of the result, thereby forming an isolation film having a first depth in the cell region, an isolation film having a second depth in the peripheral region, and an isolation film having a dual depth, which has the isolation film of the first depth and the isolation film of the second depth at the same, in the boundary region.

The region formed in the second ion implant process preferably has a depth shallower than that of the region formed in the first ion implant process.

The region formed in the second ion implant process preferably has a depth similar than that of the region formed in the first ion implant process.

The doped region can be separated from the well regions formed in the cell region and the peripheral regions.

The first ion implant process or the third ion implant process can be implanted with an N type ion.

The second ion implant process can be implanted with a P type ion.

The doped region formed by means of the first ion implant process or the third ion implant process can be formed using only an N type ion.

According to further another aspect of the present invention, there is provided an isolation film in a semiconductor device, including a semiconductor substrate in which a cell region where a predetermined well region is formed, a peripheral region and a boundary region of the cell region and the peripheral region, an isolation film having a first depth formed in the cell region, an isolation film, which is formed in the peripheral region and has a second depth shallower than the first depth of the isolation film, an isolation film having a dual depth, which has the first depth of the isolation film formed in the boundary region and the second depth of the isolation film at the same time, and a doped region that is separated from the well region of the cell region and has the semiconductor substrate of the boundary region implanted with the same ion, wherein two layers of well regions having different depths are formed in the doped region.

The isolation film can further include a field stop well provided between the well region of the cell region and the doped region.

The doped region can be implanted with the same ion as that of the well region of the cell region adjacent to the doped region.

DETAILED DESCRIPTION OF PREFERRED EMBODIMENTS

Figure 1:
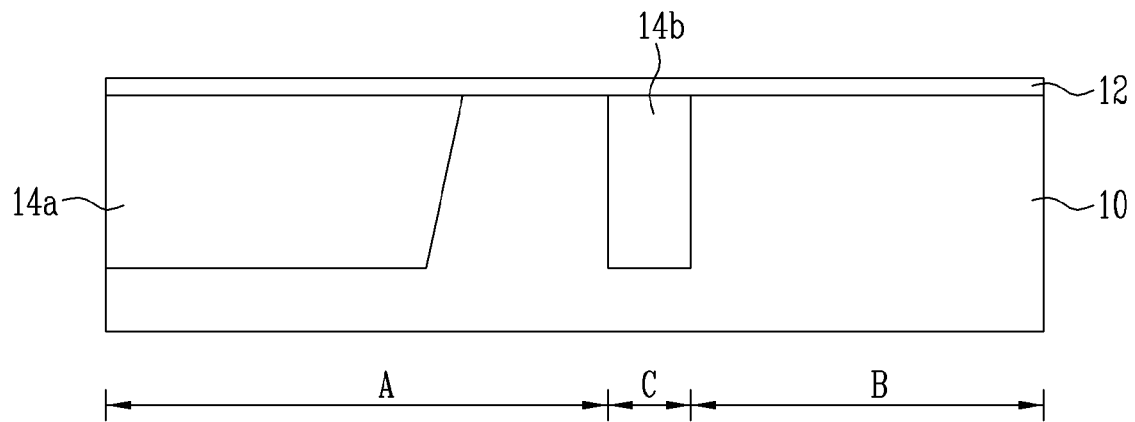
FIGS. 1 to 7 are cross-sectional views for explaining a method of forming an isolation film in a semiconductor device according to a preferred embodiment of the present invention.

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later. Meanwhile, in case where it is described that one film is "on" the other film or a semiconductor substrate, the one film may directly contact the other film or the semiconductor substrate. Or, a third film may be intervened between the one film and the other film or the semiconductor substrate. Furthermore, in the drawing, the thickness and size of each layer are exaggerated for convenience of explanation and clarity. Like reference numerals are used to identify the same or similar parts.

FIGS. 1 to 7 are cross-sectional views for explaining a method of forming an isolation film in a semiconductor device according to a preferred embodiment of the present invention.

Referring to FIG. 1, a screen oxide film 12 is formed on the entire surface of the semiconductor substrate 10 in which a cell region A, a peripheral region B, and a region C that is formed at the boundary portion between the cell region and the peripheral region, wherein an isolation film having a dual depth will be formed, are defined.

The screen oxide film 12 is formed to a thickness of about 80 Å. The screen oxide film 12 is formed so as to prevent stress, which is applied to the semiconductor substrate 10 by means of a pad nitride film formed when a process for defining the isolation film is performed. Further, the screen oxide film 12 is formed so as to prevent a channeling phenomenon generated in an ion implant process for forming a well region, etc.

A photoresist pattern (not shown) for defining a deep N well region is formed on the entire surface in which the screen oxide film 12 is formed so that the cell region A and the region C in which an isolation film having a dual depth will be formed are exposed. An ion implant process using the pattern as a mask for ion implantation is performed to form a deep N well 14a in the cell region A and a first doped region 14b in the region C in which an isolation film having a dual depth will be formed.

The ion implant process for forming the deep N well region 14a and the first doped region 14b is performed under process conditions having energy of about 1.2 to 2 Mev using phosphorous (P) ion.

Thereafter, the doped region ("D" FIG. 6) in which in which an isolation film having a dual depth will be formed is formed simultaneously with the process of forming the deep N well 14a in the cell region A, but is separated from the deep N well 14a of the cell region A. The reason why the doped region ("D" FIG. 6) in which an isolation film having a dual depth will be formed is separated from the deep N well 14a of the cell region A is to prevent a parasitic transistor from being formed in a region where an isolation film having a dual depth will be formed due to a high bias voltage applied when a cell operates.

Figure 2:
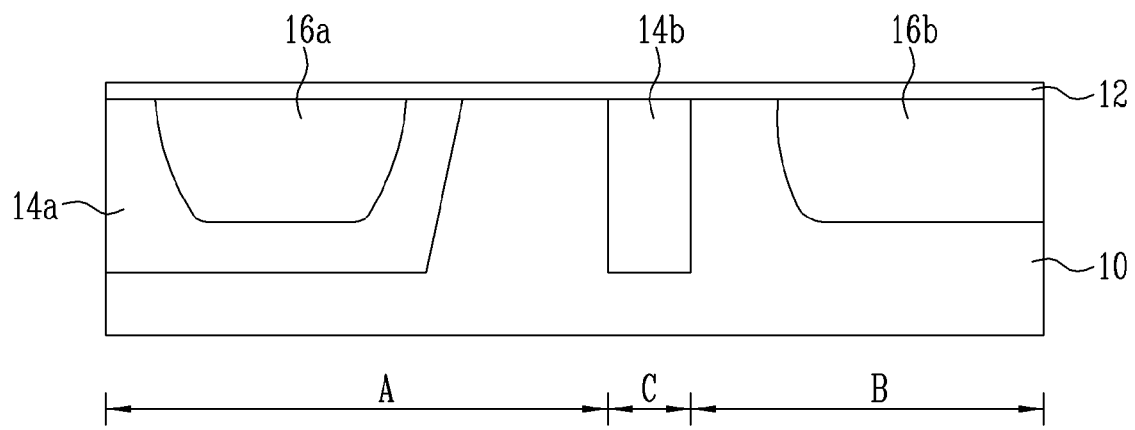

Referring to FIG. 2, a photoresist pattern (not shown) for defining a P well region is formed on the entire surface in which the deep N well region 14a and the first doped region 14b are formed so that some of the cell region A and the peripheral region B are exposed. An ion implant process using the pattern as a mask for ion implantation is performed to form P well regions 16a and 16b in the cell region A and the peripheral region B, respectively.

In the ion implant process for forming the P well regions 16a and 16b, a boron ion is implanted, but ion is not implanted into the region C where an isolation film having a dual depth will be formed.

Figure 3:
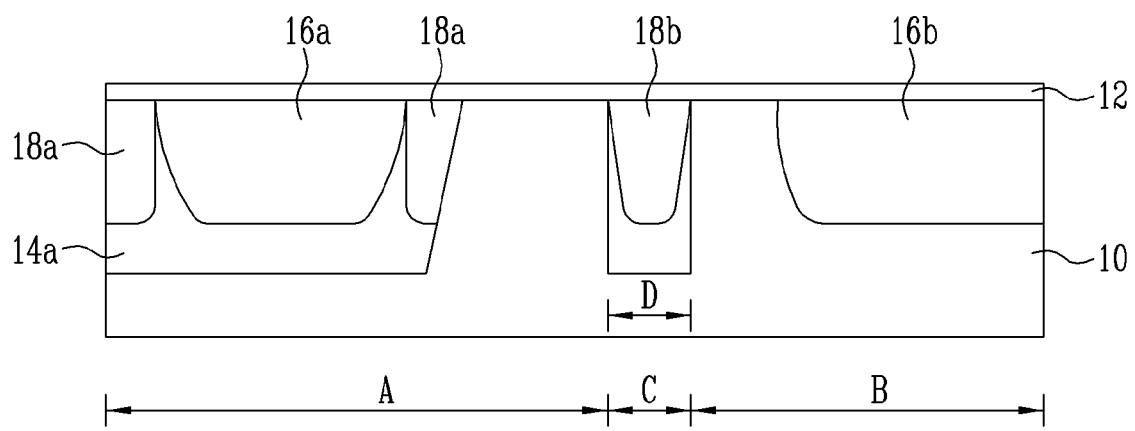

Referring to FIG. 3, a photoresist pattern (not shown) for defining a N well is formed to expose regions other than the region where the P well region 16a of the cell region A is formed and the first doped region 14b are exposed. An ion implant process using the pattern as a mask for ion implantation is performed to form N well regions 18a in the cell region A and a second doped region 18b in the region C where an isolation film having a dual depth will be formed.

The first doped regions 18a and the second doped region 18b are defined as a doped region D.

In this case, the ion implant process for forming the N well regions 18a and the second doped region 18b is performed by implanting phosphorous (P) ion or arsenic (As) ion.

At this time, the ion implant process is performed under process conditions having energy lower than that in the ion implant process for forming the deep N well region 14a. This is because a depth of the second doped region 18b is shallower than that of the first doped region 14b.

Figure 4:
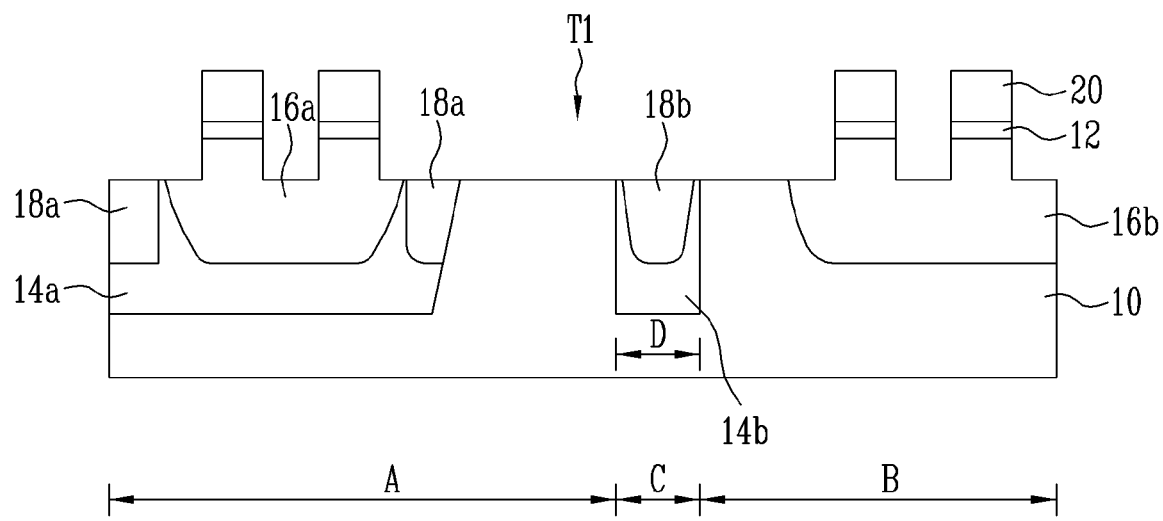

Referring to FIG. 4, a pad nitride film 20 is formed on the entire surface, and a photoresist pattern (not shown) for defining an isolation film is formed on a predetermined region of the pad nitride film 20. An etch process using the photoresist pattern as an etch mask is performed on the pad nitride film 20, the screen oxide film 12 and a predetermined depth of the semiconductor substrate, thereby forming a first trench T1.

In this case, a thickness of an isolation film to be formed in the peripheral region B is thicker than that of the isolation film to be formed in the cell region A.

Figure 5:
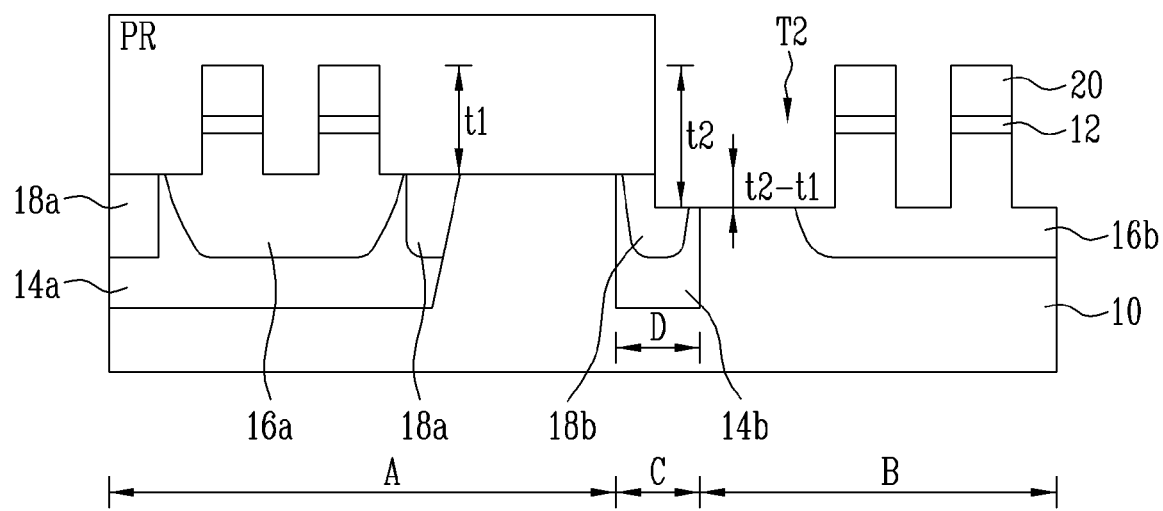

Referring to FIG. 5, a photoresist pattern PR is formed to expose the peripheral region B of the result in which the first trench T1 is formed. The semiconductor substrate 10 of the peripheral region B in which the first trench T1 is formed is etched using the photoresist pattern PR, the patterned pad nitride film of the peripheral region B, the screen oxide film, and a predetermined depth of the semiconductor substrate as an etch mask, thus forming a second trench T2.

A thicker t2 of the second trench T2 formed in the peripheral region B is thicker than a thickness t1 of the cell region the isolation film. The boundary portion of the first trench T1 and the second trench T2 is located at the center of the doped region D.

The trenches of a different thickness are formed in the doped region. The doped region has an N well region formed in. This is for preventing the leakage current, which is generated due to damage generated in an etch process for forming an isolation film having a dual depth and damage incurred by shortage of thermal budget.

Figure 6:
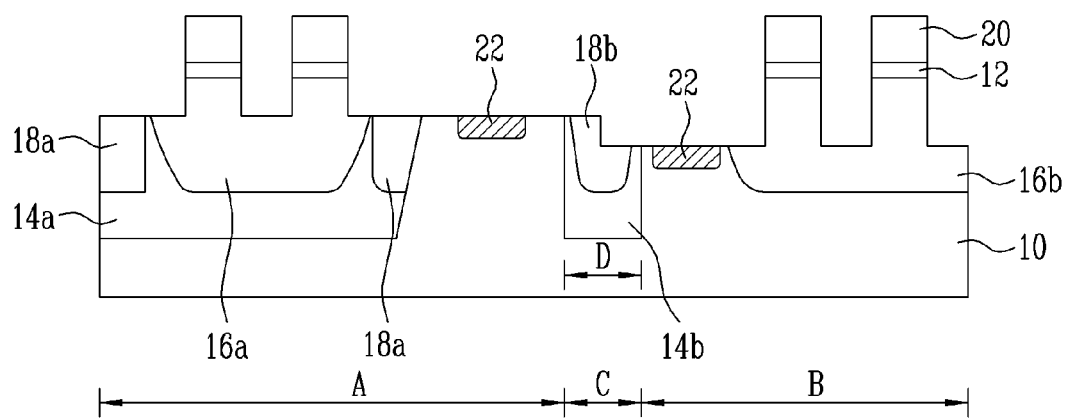

Referring to FIG. 6, the formed photoresist pattern PR is removed, and a photoresist pattern (not shown) for defining a field stop well is formed so that the semiconductor substrate in which the deep N well region 14a, the doped region D, the P well regions 16a and 16b, and the N well regions 18a and 18b are not formed. An ion implant process using the pattern as a mask for ion implantation is performed to form a field stop well region 22.

The field stop well region 22 is formed around the isolation film that requires a well breakdown voltage (hereinafter, referred to as "BVDSS") of 20V or higher. In the present embodiment, the field stop well region 22 is formed in the cell region and the peripheral region, respectively, at both sides of the doped region D. At this time, the field stop well 22 must be formed between the deep N well region 14a of the cell region A and the doped region D.

Further, the field stop well region 22 is formed with 0.5 to 3.0 μm being far from the deep N well region 14a. This is for the purpose of securing BVDSS characteristics.

Moreover, formation of the field stop well region is to isolate the doped region D from the well regions of the cell region and the well regions of the peripheral region.

Figure 7:
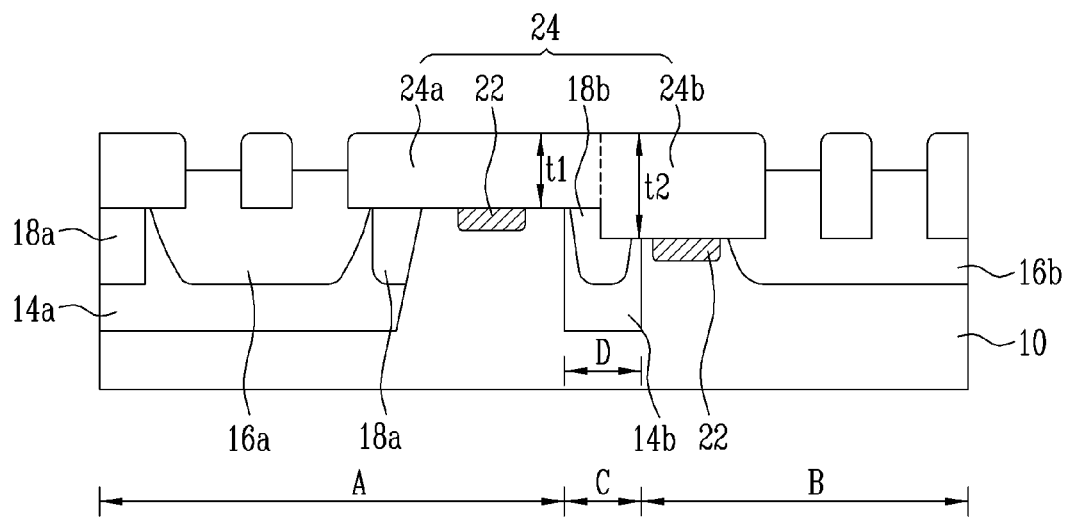

Referring to FIG. 7, after an insulating film for trench burial is formed on the entire surface in which the field stop well 22 is formed, a polishing process such as a CMP process is performed until the pad nitride film 20 is exposed, forming an isolation film 24a for cell region in the cell region and an isolation film 24b for peripheral circuit in the peripheral region.

If the etch process for removing the pad nitride film 20 from the entire surface in which the isolation film 24 is formed, the formation process of the isolation films 24a are 24b is completed.

The isolation film formed on the doped region D located at the interface between the cell region A and the peripheral region B has a dual depth having a depth of the isolation film for the cell region and a depth of the isolation film for the peripheral region at the same time.

Furthermore, the doped region D in which the isolation film having the dual depth is formed is completely separated from the cell region A. This serves to isolate the leakage current caused by dislocation that can be generated in an isolation film formation process having a dual depth. It also serves to prevent formation of a path through which the leakage current flows because an N well BVDSS is high although a parasitic transistor is formed.

The isolation film in the semiconductor device according to the present invention, which is formed through a series of the processes, includes the semiconductor substrate 10 in which the cell region A where the predetermined well regions 14a, 16a and 18a are formed, the peripheral region B, and the boundary region C between the cell region A and the peripheral region B are defined, the isolation film 24a that is formed in the cell region A and has a first depth, the isolation film 24b that is formed in the peripheral region and has a second depth deeper than the first depth of the isolation film 14b, the isolation film 24, which is formed in the boundary region C, and has a dual depth of the first depth of the isolation film 24a and the second depth of the isolation film 24b at the same time, and the field stop well 22 separated from the well region of the cell region, wherein the same ion is implanted into the semiconductor substrate of the boundary region, and the field stop well 22 is formed between the doped region D in which the well regions 14b and 18b having different depths are formed, and the well region and the doped region of the cell region.

As described above, according to the present invention, a doped region is separated from a deep N well of a cell region. Accordingly, the present invention has an effect in that remove defects, such as formation of a parasitic transistor in a region where an isolation film having a dual depth is formed due to a high bias voltage applied when a cell operates, can be removed.

Furthermore, according to the present invention, trenches of a different thickness are formed in a doped region, and a N well region is formed in the doped region. Accordingly, the present invention has an effect in that the leakage current, which is caused because of damage in an etch process for forming an isolation film having a dual depth and damage generated in a thermal budget, can be prevented.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. An isolation film in a semiconductor device, comprising:
   a semiconductor substrate in which a cell region where a predetermined well region is formed, a peripheral region and a boundary region of the cell region and the peripheral region;
   an isolation film having a first depth formed in the cell region;

an isolation film, which is formed in the peripheral region and has a second depth deeper than the first depth of the isolation film;

an isolation film having a dual depth, which has the first depth of the isolation film formed in the boundary region and the second depth of the isolation film at the same time; and a doped region that is separated from the well region of the cell region and has the semiconductor substrate of the boundary region implanted with the same ion, wherein two layers of well regions having different depths are formed in the doped region.

2. The isolation film as claimed in claim 1, further including a field stop well provided between the well region of the cell region and the doped region.

3. The isolation film as claimed in claim 1, wherein the doped region is implanted with the same ion as that of the well region of the cell region adjacent to the doped region.

* * * * *